(12) United States Patent
Amit et al.

(10) Patent No.: US 9,141,631 B2
(45) Date of Patent: *Sep. 22, 2015

(54) TABLE BOUNDARY DETECTION IN DATA BLOCKS FOR COMPRESSION

(75) Inventors: Jonathan Amit, Yehud (IL); Lilia Demidov, Yehud (IL); Nir Halowani, Yehud (IL)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 228 days.

This patent is subject to a terminal disclaimer.

(21) Appl. No.: 13/448,159

(22) Filed: Apr. 16, 2012

(65) Prior Publication Data

US 2013/0275397 A1  Oct. 17, 2013

(51) Int. Cl.
 *G06F 7/00* (2006.01)
 *G06F 17/30* (2006.01)
 *H03M 7/30* (2006.01)

(52) U.S. Cl.
 CPC .......... *G06F 17/30153* (2013.01); *H03M 7/30* (2013.01)

(58) Field of Classification Search
 CPC ... G06F 17/30; G06F 17/22; G06F 17/30153; H03M 7/42
 See application file for complete search history.

(56) References Cited

U.S. PATENT DOCUMENTS

| 5,270,712 | A | 12/1993 | Iyer et al. |
| 5,396,595 | A * | 3/1995 | Standley .................. 710/68 |
| 7,734,603 | B1 | 6/2010 | McManis |
| 8,332,209 | B2 * | 12/2012 | Grinblat .................. 704/10 |
| 2004/0193729 | A1 | 9/2004 | Saraph |
| 2008/0209296 | A1 * | 8/2008 | Crandford et al. .......... 714/747 |
| 2010/0131476 | A1 | 5/2010 | Kataoka et al. |
| 2011/0066668 | A1 | 3/2011 | Guarraci |
| 2011/0128960 | A1 * | 6/2011 | Bando et al. .................. 370/392 |
| 2011/0167030 | A1 * | 7/2011 | Bremler-Barr et al. ......... 706/48 |
| 2012/0046879 | A1 | 2/2012 | Ruemer et al. |

FOREIGN PATENT DOCUMENTS

GB  WO2011048400 A1  4/2011

OTHER PUBLICATIONS

Jessica Lin, A Symbolic Representation of Time Series, with Implications for Streaming Algorithms, Jun. 13, 2003.*
"Method for a memory layout for a compressed video data processing system", ip.com No. IPCOM000008007D, May 10, 2002, 10 pages.
Batalden, et al., "Compressed Sequential Data on a Fixed Block Device", IBM TDB n9 02-91 p. 158-164, Feb. 1, 1991, 8 pages.

* cited by examiner

*Primary Examiner* — Apu Mofiz
*Assistant Examiner* — Thu Nga Nguyen
(74) *Attorney, Agent, or Firm* — Griffith & Seaton PLLC

(57) ABSTRACT

Data is converted into a minimized data representation using a suffix tree by sorting data streams according to symbolic representations for building table boundary formation patterns. The converted data is fully reversible for reconstruction while retaining minimal header information.

14 Claims, 7 Drawing Sheets

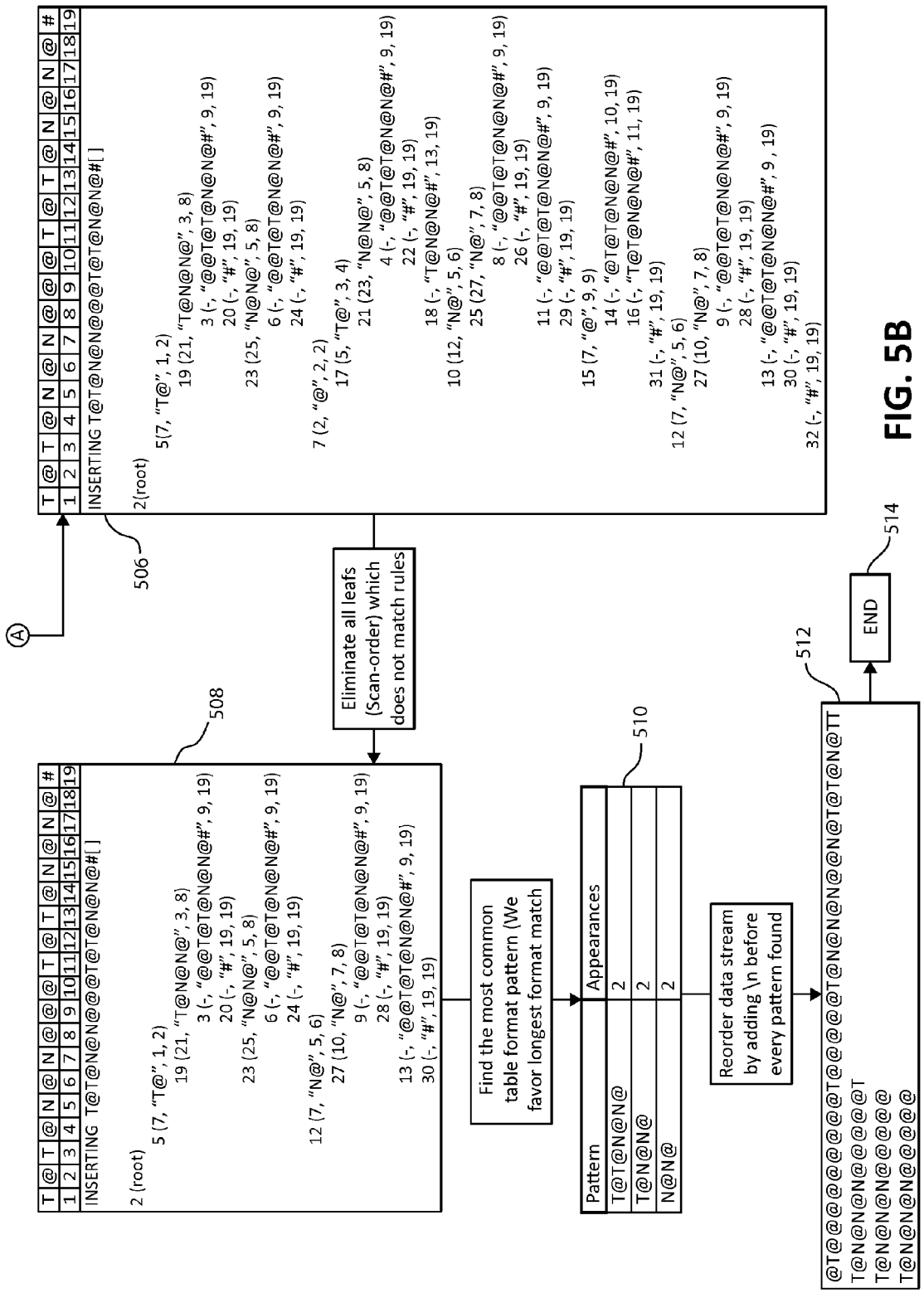

OUTPUT FILE WITH HEADER INFORMATION

| Format | Separator | Size (Number of Rows) | Added \n or not | How many tables found |
|---|---|---|---|---|
| T@T@N@N@ | @ | 4 | 1=yes, 0=no | 1 - only one, 2 - more than one (In this case the preceding data is the header of the second table) |

FIG. 6

TABLE BOUNDARY DETECTION IN DATA BLOCKS FOR COMPRESSION

BACKGROUND OF THE INVENTION

1. Field of the Invention

The present invention relates in general to computers, and more particularly to table boundary detection in data blocks for compression in a computing environment.

2. Description of the Related Art

In today's society, computer systems are commonplace. Computer systems may be found in the workplace, at home, or at school. Computer systems may include data storage systems, or disk storage systems, to process and store data. Data storage systems, or disk storage systems, are utilized to process and store data. A storage system may include one or more disk drives. These data processing systems typically require a large amount of data storage. Customer data, or data generated by users within the data processing system, occupies a great portion of this data storage. Many of these computer systems include virtual storage components.

Data compression is widely used to reduce the amount of data required to process, transmit, or store a given quantity of information. Data compression is the coding of data to minimize its representation. Compression can be used, for example, to reduce the storage requirements for files, to increase the communication rate over a channel, or to reduce redundancy prior to encryption for greater security.

SUMMARY OF THE DESCRIBED EMBODIMENTS

Computing systems are used to store and manage a variety of types of data, such as so-called "tabular data." Tabular data is typically organized into rows and columns to form common tables, e.g., as used in relational tables, word processing documents, spreadsheets or spreadsheet-like structures, or similar database structures. The formation of these tables includes a variety of organized arrays and arrangements for the rows and columns. However, the actual physical storage of the tabular data may take a variety of forms. For example, although the logical structure of the tabular data may be multidimensional, the tabular data may physically be stored in linear format, such as in row-major or column major format. In row-major format, column values of a row from the table-like structure are stored contiguously in persistent storage. In most data files, important information is typically stored and arranged in table form. The data in the tables may be stored and extracted. However, identification of the formation of the data in the tables is essential for querying and joining the data with data using other various management systems. Currently, it is difficult to improve the detection of table boundaries in data blocks for compression due to various challenges.

Accordingly, and in view of the foregoing, various exemplary method, system, and computer program product embodiments for detecting table boundaries in data blocks for compression by a processor device in a computing environment are provided. In one embodiment, by way of example only, data is converted into a minimized data representation using a suffix tree by sorting data streams according to symbolic representations for building table boundary formation patterns. The converted data is fully reversible for reconstruction while retaining minimal header information.

In addition to the foregoing exemplary method embodiment, other exemplary system and computer product embodiments are provided and supply related advantages. The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which:

FIG. 5A-B is a flow chart diagram illustrating an additional exemplary method for identifying the best suggested data table format, here again in which aspects of the present invention may be realized; and FIG. 6 is a block diagram illustrating an exemplary output data file with header information.

DETAILED DESCRIPTION OF THE DRAWINGS

Figure 1:
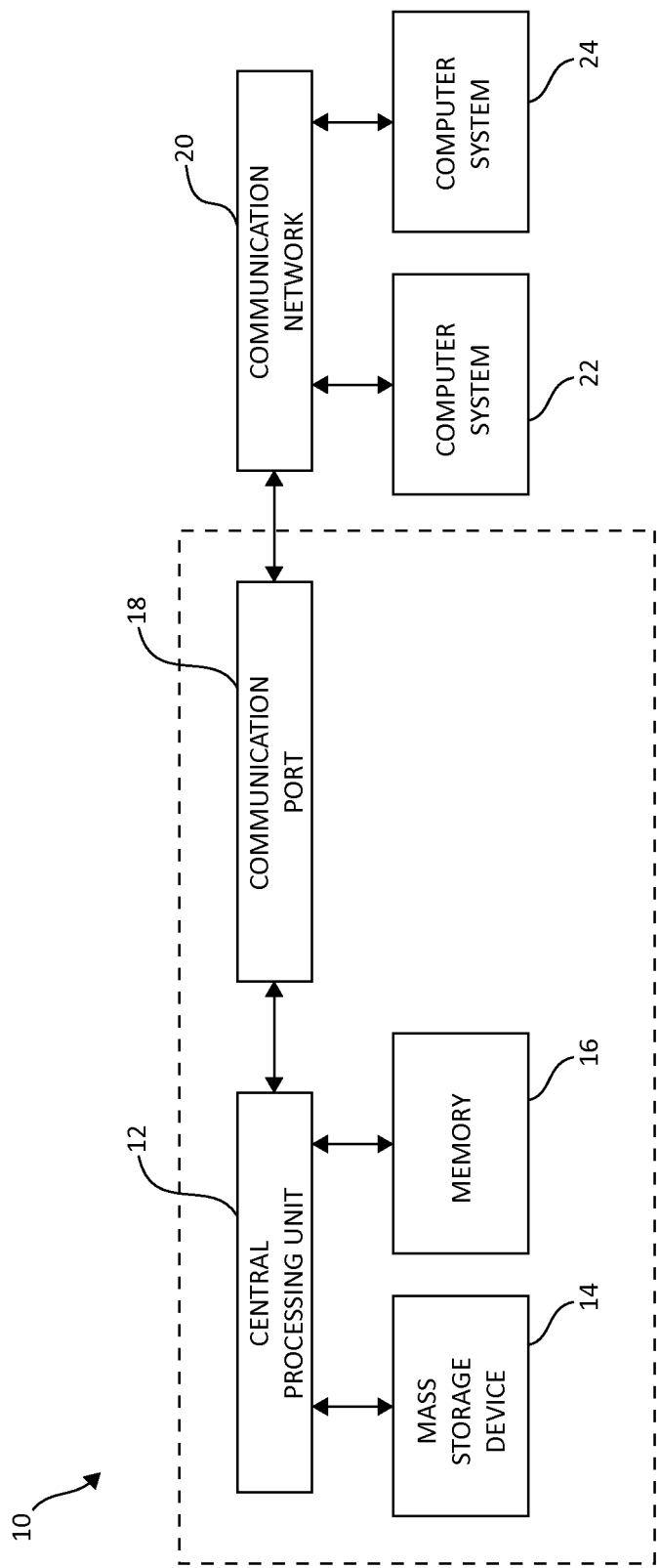
FIG. 1 is a block diagram illustrating a computer storage environment having an exemplary storage device in which aspects of the present invention may be realized.

As previously mentioned, computing systems are used to store and manage a variety of types of data, such as tabular data. Tabular data is typically organized into rows and columns to form common tables, e.g., as used in relational tables, word processing documents, spreadsheets or spreadsheet-like structures, or similar database structures. Tabular data column format, as a specific document component, is widely used in web pages, scientific documents, financial reports, etc. For example, researchers typically use tables to concisely display the latest experimental results or statistical financial data in a condensed fashion. Along with the rapid expansion of the Internet, tables become a valuable information source in the information retrieval field. In most data files (e.g., article/database/excel/word), the most important information being reported is presented in table form. Furthermore, most data reported in tables may be extracted and stored in a manner that improves the data search and compression. Once the formation of the data is identified, the data may be queried and joined with data using other management systems.

However, it is nearly impossible to improve the identification and detection of table boundaries in a storage array due to the following problems. 1) Most table detection works are pre-defined layout based algorithms, which usually work well for one domain but are difficult to extend. 2) For the rule-based methods, the performance is always heavily affected by the quality of the rules. When the testing data set is large enough, it is difficult to determine the "good" values for thresholds. 3) The data written to the storage is in progressive mode, which means the storage receives only part of the data stream. 4) Most sort detection operations change the original data stream in a manner that may not be reconstructed. 5) Most sort detection operations require a large resource maintained in the output data for reconstructing the original block. As a result of these problems, efficiency and productivity may be reduced.

In contrast, and to address the inefficiencies and performance issues described, the illustrated embodiments provide mechanisms for improving the table formation detection in storage arrays. The mechanisms provide an effective preprocessing operation for detecting a table boundary by building a minimized data block mapping schema and sorting the mapping block in a manner which identifies "best" (e.g., the longest pattern representation and/or most common patterns) table boundary formation matches. Thus, the mechanisms simplify the table boundary detection problem and sort the data stream in a manner that is fully reversible while retaining very minimal header information needed for output formation. In other words, by providing an operation for detecting table boundaries by building a minimized data block mapping schema and then sorting the mapping block in a manner which identifies "best" table formation matches, the data may be efficiently sorted into a reordered data output stream for compression. Within the sorted data output file, header information may be listed containing the identified table boundary pattern. Also within the reordered (sorted) data output stream, a separator symbol may be added before every detected table boundary pattern in order to differentiate the table boundaries. The output file may also contain the size (e.g., the number of rows) and the number of tables found. With the information as described above in the reordered data output file, the data stream is fully reversible for decoding back into the original data stream.

Unlike most table detection methods, which are the predefined layout based and the rule-based methods, the illustrated embodiments seek to provide a general algorithm, which can be applied for table boundary detection of all data block types and formats. In one such embodiment, the mechanisms convert data for data compression by searching with a suffix tree to identify a table and its layout and place the identification information in a header and compress the data. The mechanisms of the illustrated embodiments may be applied in real-time to progressive storage writes and may be implemented in a storage array. Also, it should be noted that present invention identifies the data structure by building a suffix tree for a mapped version of the data and not by checking meta-data or content headers, and also, does not assume any special data formation dependencies. The use of the suffix tree allows for dynamically building the data classification formation. In other words, the mechanisms of the illustrated embodiments identify data classification for a given data block by analyzing the content of the data block through a map of original data created.

Turning now to FIG. 1, exemplary architecture 10 of data storage systems (e.g., virtual tape systems) in a computing environment is depicted. The computer system 10 includes central processing unit (CPU) 12, which is connected to mass storage device(s) 14 and memory device 16. Mass storage devices can include hard disk drive (HDD) devices, solid-state devices (SSD) etc, which can be configured in a redundant array of independent disks (RAID). The backup operations further described can be executed on device(s) 14, located in system 10 or elsewhere. Memory device 16 can include such memory as electrically erasable programmable read only memory (EEPROM) or a host of related devices. Memory device 16 and mass storage device 14 are connected to CPU 12 via a signal-bearing medium. In addition, CPU 12 is connected through communication port 18 to a communication network 20, having an attached plurality of additional computer systems 22 and 24.

Figure 2:
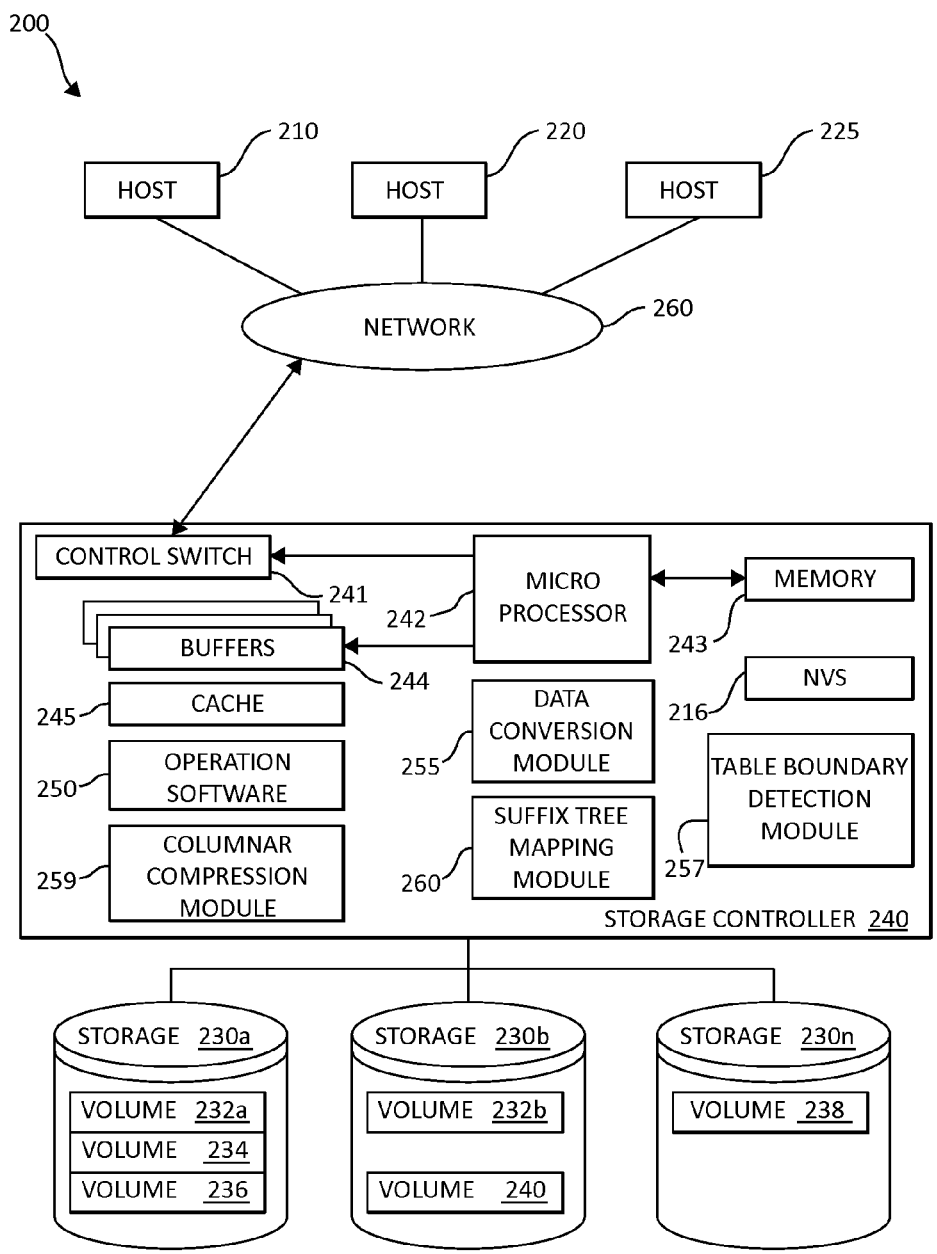
FIG. 2 is a block diagram illustrating a hardware structure of an exemplary data storage system in a computer system in which aspects of the present invention may be realized.

FIG. 2 is an exemplary block diagram 200 showing a hardware structure of a data storage system in a computer system according to the present invention. Referring to FIG. 2, there are shown host computers 210, 220, 225, each acting as a central processing unit for performing data processing a part of a data storage system 200. The hosts (physical or virtual devices), 210, 220, and 225 may be one or more new physical devices or logical devices to accomplish the purposes of the present invention in the data storage system 200. In one embodiment, by way of example only, a data storage system 200 may be implemented as IBM® System Storage™ DS8000™. A network connection 260 may be a fibre channel fabric, a fibre channel point to point link, a fibre channel over ethernet fabric or point to point link, a FICON or ESCON I/O interface, any other I/O interface type, a wireless network, a wired network, a LAN, a WAN, heterogeneous, homogeneous, public (i.e. the Internet), private, or any combination thereof. The hosts, 210, 220, and 225 may be local or distributed among one or more locations and may be equipped with any type of fabric (or fabric channel) (not shown in FIG. 2) or network adapter 260 to the storage controller 240, such as Fibre channel, FICON, ESCON, Ethernet, fiber optic, wireless, or coaxial adapters. Data storage system 200 is accordingly equipped with a suitable fabric (not shown in FIG. 2) or network adapter 260 to communicate. Data storage system 200 is depicted in FIG. 1 comprising storage controller 240 and storage 230.

To facilitate a clearer understanding of the methods described herein, storage controller 240 is shown in FIG. 2 as a single processing unit, including a microprocessor 242, system memory 243 and nonvolatile storage ("NVS") 216, which will be described in more detail below. It is noted that in some embodiments, storage controller 240 is comprised of multiple processing units, each with their own processor complex and system memory, and interconnected by a dedicated network within data storage system 200. Storage 230 may be comprised of one or more storage devices, such as storage arrays, which are connected to storage controller 240 by a storage network.

In some embodiments, the devices included in storage 230 may be connected in a loop architecture. Storage controller 240 manages storage 230 and facilitates the processing of write and read requests intended for storage 230. The system memory 243 of storage controller 240 stores program instructions and data, which the processor 242 may access for executing functions and method steps associated with managing storage 230 and executing the steps and methods of the present invention for identifying table boundaries in data blocks for compression in a computer storage environment. In one embodiment, system memory 243 includes, is associated, or is in communication with the operation software 250 for identifying table boundaries in data blocks in a computer storage environment, including the methods and operations described herein. As shown in FIG. 2, system memory 243 may also include or be in communication with a cache 245 for storage 230, also referred to herein as a "cache memory", for buffering "write data" and "read data", which respectively refer to write/read requests and their associated data. In one embodiment, cache 245 is allocated in a device external to system memory 243, yet remains accessible by microprocessor 242 and may serve to provide additional security against data loss, in addition to carrying out the operations as described in herein.

In some embodiments, cache 245 is implemented with a volatile memory and non-volatile memory and coupled to microprocessor 242 via a local bus (not shown in FIG. 2) for enhanced performance of data storage system 200. The NVS 216 included in data storage controller is accessible by microprocessor 242 and serves to provide additional support for operations and execution of the present invention as described in other figures. The NVS 216, may also referred to as a "persistent" cache, or "cache memory" and is implemented with nonvolatile memory that may or may not utilize external power to retain data stored therein. The NVS may be stored in and with the Cache 245 for any purposes suited to accomplish the objectives of the present invention. In some embodiments, a backup power source (not shown in FIG. 2), such a battery, supplies NVS 216 with sufficient power to retain the data stored therein in case of power loss to data storage system 200. In certain embodiments, the capacity of NVS 216 is less than or equal to the total capacity of cache 245.

Storage 230 may be physically comprised of one or more storage devices, such as storage arrays. A storage array is a logical grouping of individual storage devices, such as a hard disk. In certain embodiments, storage 230 is comprised of a JBOD (Just a Bunch of Disks) array or a RAID (Redundant Array of Independent Disks) array. A collection of physical storage arrays may be further combined to form a rank, which dissociates the physical storage from the logical configuration. The storage space in a rank may be allocated into logical volumes, which define the storage location specified in a write/read request.

In one embodiment, by way of example only, the storage system as shown in FIG. 2 may include a logical volume, or simply "volume," may have different kinds of allocations. Storage 230a, 230b and 230n are shown as ranks in data storage system 200, and are referred to herein as rank 230a, 230b and 230n. Ranks may be local to data storage system 200, or may be located at a physically remote location. In other words, a local storage controller may connect with a remote storage controller and manage storage at the remote location. Rank 230a is shown configured with two entire volumes, 234 and 236, as well as one partial volume 232a. Rank 230b is shown with another partial volume 232b. Thus volume 232 is allocated across ranks 230a and 230b. Rank 230n is shown as being fully allocated to volume 238—that is, rank 230n refers to the entire physical storage for volume 238. From the above examples, it will be appreciated that a rank may be configured to include one or more partial and/or entire volumes. Volumes and ranks may further be divided into so-called "tracks," which represent a fixed block of storage. A track is therefore associated with a given volume and may be given a given rank.

The storage controller 240 may include a data conversion module 255, table boundary detection module, columnar compression module 259, and a suffix tree-mapping module 260 to assist with identifying table boundaries in data blocks in a computer storage environment. The data conversion module 255, table boundary detection module, columnar compression module 259, and suffix tree mapping module 260 may work in conjunction with each and every component of the storage controller 240, the hosts 210, 220, 225, and storage devices 230. The data conversion module 255, table boundary detection module, columnar compression module 259, and suffix tree mapping module 260 may be structurally one complete module working together and in conjunction with each other for performing such functionality as identifying table boundaries in data blocks, or may be individual modules. The data conversion module 255, table boundary detection module, columnar compression module 259, and suffix tree mapping module 260 may also be located in the cache 245 or other components of the storage controller 240 to accomplish the purposes of the present invention.

The storage controller 240 may be constructed with a control switch 241 for controlling the fiber channel protocol to the host computers 210, 220, 225, a microprocessor 242 for controlling all the storage controller 240, a nonvolatile control memory 243 for storing a microprogram (operation software) 250 for controlling the operation of storage controller 240, data for control and each table described later, cache 245 for temporarily storing (buffering) data, and buffers 244 for assisting the cache 245 to read and write data, a control switch 241 for controlling a protocol to control data transfer to or from the storage devices 230, data conversion module 255, table boundary detection module, columnar compression module 259, and suffix tree mapping module 260 on which information may be set. Multiple buffers 244 may be implemented with the present invention to assist with identifying table boundaries in data blocks in a computing environment, or performing other functionality in accordance with the mechanisms of the illustrated embodiments.

In one embodiment, by way of example only, the host computers or one or more physical or virtual devices, 210, 220, 225 and the storage controller 240 are connected through a network adaptor (this could be a fiber channel) 260 as an interface i.e., via a switch sometimes referred to as "fabric." In one embodiment, by way of example only, the operation of the system shown in FIG. 2 will be described. The microprocessor 242 may control the memory 243 to store command information from the host device (physical or virtual) 210 and information for identifying the host device (physical or virtual) 210. The control switch 241, the buffers 244, the cache 245, the operating software 250, the microprocessor 242, memory 243, NVS 216, data conversion module 255, table boundary detection module, columnar compression module 259, and suffix tree mapping module 260 are in communication with each other and may be separate or one individual component(s). Also, several, if not all of the components, such as the operation software 245 may be included with the memory 243 for identifying table boundaries in data blocks for compression in a computer storage environment. Each of the components within the storage device may be linked together and may be in communication with each other for purposes suited to the present invention.

Figure 3:
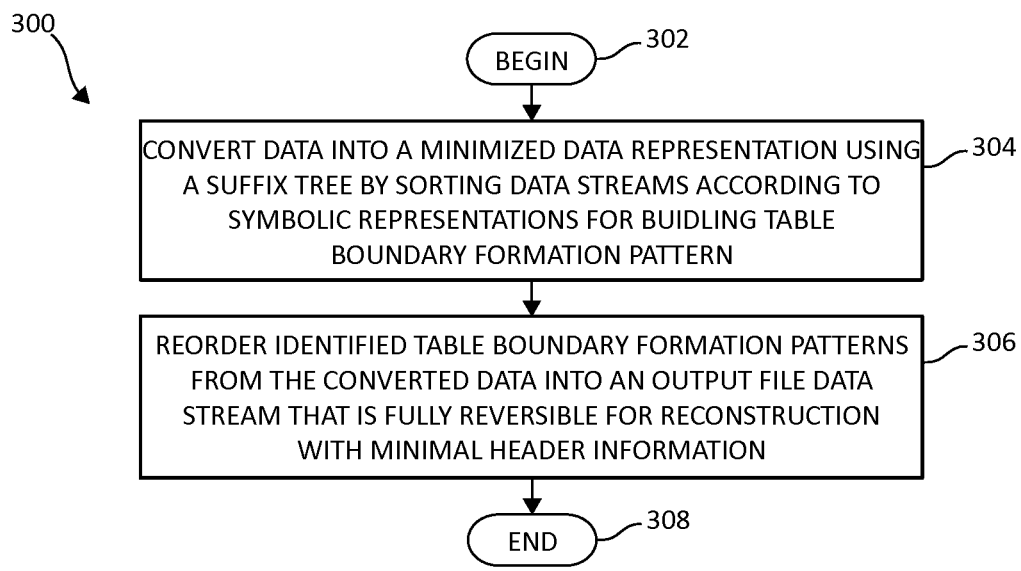
FIG. 3 is a flow chart diagram illustrating an exemplary method for identifying a "best" suggested data table format, in which aspects of the present invention may be realized.

Turning now to FIG. 3, an exemplary method 300 for identifying a "best" suggested data table format, is illustrated. The method 300 begins (step 302) by identifying table boundaries in data blocks for compression (e.g., column compression) by converting data into a minimized data representation using a suffix tree by sorting data streams according to symbolic representations for building table boundary formation pattern (step 304). Data streams are sorted according to symbolic representations (e.g., the letter "T" may be used for text data and the letter "N" may be used for numerical data) for building table boundary patterns. By converting the data streams according to the symbolic representation, the method 300 is able to build the minimized data representations into a mapping schema and sort the mapping blocks in a manner to identify the longest pattern representation table boundary match. A suffix tree is used for finding the best (e.g., the longest pattern representation of the minimized data) suggested table formation given the minimized mapped input buffer as input for the tree. The detected table boundary formation patterns of the converted data is reordered into an output file data stream that is fully reversible for reconstruction with minimal header information fully reversible for reconstruction while retaining minimal header information (step 306). The method 300 ends (step 308).

In one embodiment, the mechanisms of the illustrated embodiments identify table boundaries based upon the following 6 steps. 1) Data streams are converted to minimized representations. 2) A proposed table boundary pattern list is built. 3) The most common table boundary formation patterns are searched for and identified. 4) The sorted data streams are reordered by adding a "\n" (and/or other symbolic representation such as an "@" symbol) before every pattern that is found and table formation boundaries are differentiated. 5) In the output file, header information is listed containing the identified the table boundary formation patterns (e.g., labeled as "format"), a separator symbol (e.g., "@)"), the size (e.g., the number of rows), and the number of tables found. These steps may be repeated for finding subsequent tables, if they exist. Also, the mechanisms of the illustrated embodiments may add graphs and tables with sequences. The graph may be generated using the pattern matching process results and all patterns smaller than threshold patterns found are eliminated.

The converting of data (e.g., data blocks) to a minimized representation is important to reduce detection time and minimize the processed data. In one embodiment the following rules may be applied for converting of data. Textual data may be replaced with a symbol and/or character indicating the data is text. For example, the mechanisms may replace textual data with the letter "T" for the minimized data representation. The "T" text column is defined as a sequence of characters, which are not included in the delimiters list and digit list. Numerical data may be replaced with an alternative symbol and/or alternative character indicating the data is numerical. For example, the mechanisms of the illustrated embodiments may replace the numerical data with the letter "N" for the minimized data representation. The "N" number column is defined as a sequence of digits characters, which are not included in the delimiters list. In other words, the textual data is a sequence of characters not included in a delimiters list and a digits list, and the numerical data is a sequence of digit characters not included in a delimiters list. A digits list and a delimiters list may be used by the mechanisms of the illustrated embodiments. Also, a delimiter may also be replaced with a unique symbol and/or character for the minimized data representation. For example, the mechanisms of the illustrated embodiments may replace the delimiter with the character "@" for the minimized data representation. The "@" is a predefined list of known delimiters and separation used for detecting table boundaries in data blocks. Based upon the symbols and/or characters applied for the test, numbers, and delimiters, the converted data minimized for data representation may be translated to:
@T@@@@@@@@@T@@@@@T@N@N@N@@N@
T@T@N@TT
T@N@N@N@@@@@T
T@N@N@N@@@@@T@N@N@N@@@@@.

Once the data blocks are converted into a minimized data representation, a proposed table boundary patterns list is built. In one embodiment, the mechanisms of the illustrated embodiments scan the converted data string to get the best (e.g., the longest and most common) table boundary patterns. The mechanism may operation according the following scan rules. Rule (1): The mechanisms may search for the suffix of the minimized data representation and identify the sequence, which includes more than one item (For example: T@N|N@T|T@T|N@N). Rule (2): The mechanisms may skip all minimized data representations that only include delimiters (e.g., the "@" symbol that may be referred to as a third symbol and/or character), even if the minimized data representations are different in every byte, until the next suffix string as defined in the first rule (1). In other words, the data that only includes the third symbol (e.g., the "@" symbol) for identifying the delimiters are skipped until the next data sequence that includes the first and second symbol representing the textual and numerical data. It should be noted that the "T" symbol/character may be referred to as the first symbol/character and the "N" symbol/character may be referred to as the second symbol/character). Rule (3): The mechanism may build a suffix tree of the converted data stream representation. It should be noted that for performance, only part of the converted representation may be considered. Rule (4): After building and generating the suffix tree, the mechanisms eliminate all leafs (e.g., scan-orders) which do not match Rule (1) and Rule (2).

After the proposed table boundary formation patterns list is built, the mechanisms of the illustrated embodiments search for the most common table boundary formation patterns. From the scan order table generated according to the scan rules, the mechanisms of the illustrated embodiments search for all branching nodes and may choose the most common patter string. For example, the following patterns strings and the number of appearances may be identified: Pattern 1: T@T@N@N@ and the corresponding number of appearances found is equal to 2. Pattern 2: T@N@N@ and the corresponding number of appearances found is equal to 2. Pattern 3: N@N@ and the corresponding number of appearances found is equal to 2. In this example, Pattern 1 illustrates the longest representation pattern (and/or most common pattern string) of T@T@N@N@, which represent the best (e.g., the longest pattern representation) table boundary formation for the given data stream. It should be noted that in case several leafs have the same number of appearances the mechanisms may favor the longest pattern representation as the best suggested table format for the data stream.

At this point, the mechanisms may reorder the data streams by adding an "\n" before of the most common string pattern found in order to differentiate the table boundaries. For example: If the longest common pattern the mechanisms found is T@T@N@N@ than the following before and after reordering operations may be illustrated with the T@T@N@N@ pattern being identified:
Before Reorder:
@T@@@@@@@@@T@@@@@T@N@N@N@@N@
T@T@N@TT
T@N@N@N@@@@@T
T@N@N@N@@@@@T@N@N@N@@@@@
After Reorder:
@T@@@@@@@@@T@@@@@T@N@N@N@@N@
T@T@N@TT
T@N@N@N@@@@@T
T@N@N@N@@@@@
T@N@N@N@@@@@

This processing is reversible and enables the mechanisms to reconstruct the original data block order without any additional information needed for output format. In other words, in the output file, header information is listed containing the identified table format pattern (e.g., labeled as "format" in the header), the separator symbol, the size (e.g., the number of rows), whether the ln was implemented and use, and the number of tables found. It should be noted that if the mechanisms identify more than one table (e.g., 2 tables) then another header may be added after the first one and the added header describes the second table. If the mechanisms identify more than one table, the first table rows are at the location

[1+Number of tables]. At this point, the mechanisms provide for a reversible data stream, which can be separated cleanly to the table formats found.

Figure 4:
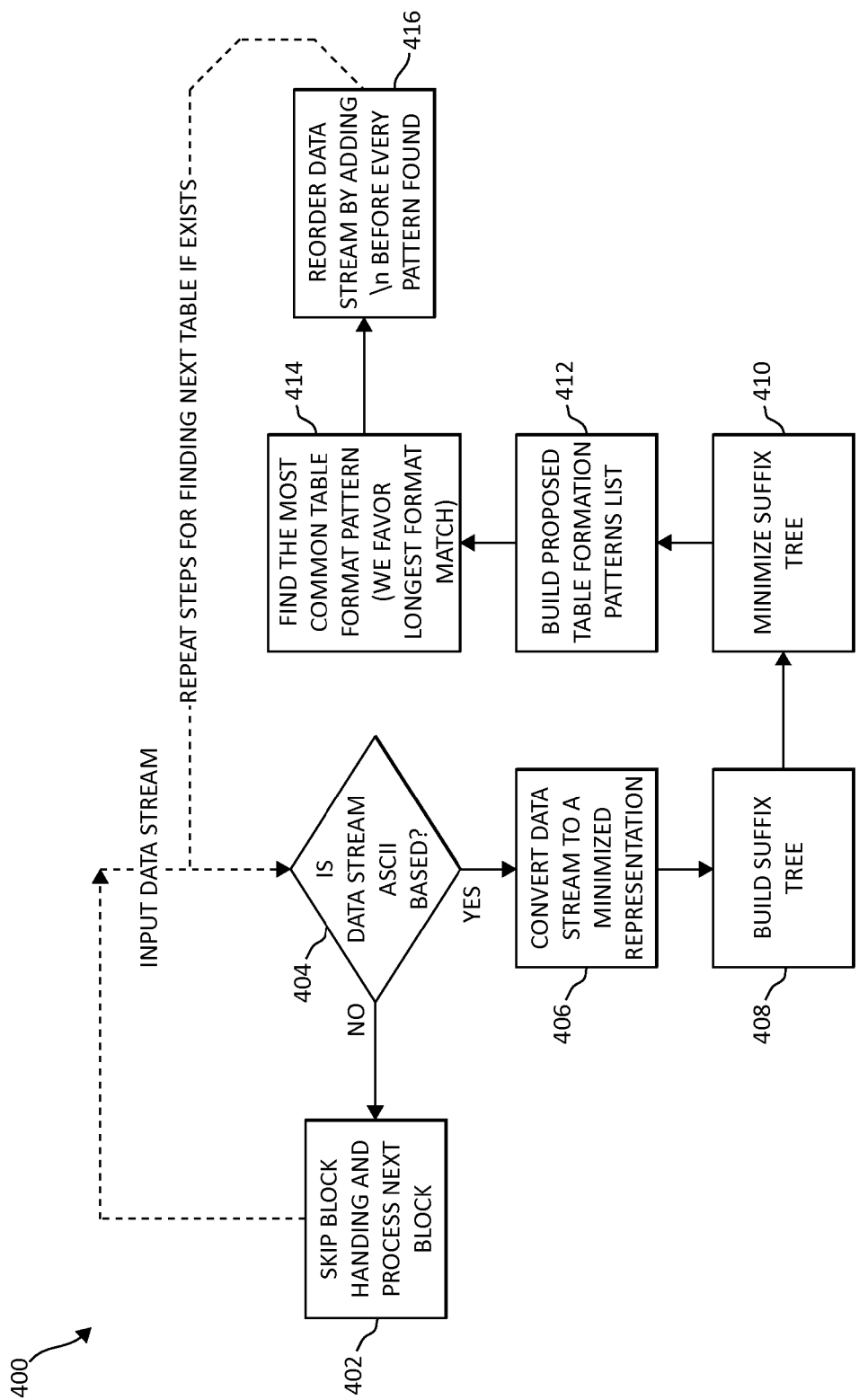
FIG. 4 is a flow chart diagram illustrating an additional exemplary method for identifying the best suggested data table format, again in which aspects of the present invention may be realized.

Based upon the foregoing, turning now to FIG. 4, an additional exemplary method 400 for identifying the best-suggested data table format is depicted. The method 400 begins by skipping block handling and processing the next data block (step 402). Upon receiving an input stream, the method 400 may determine if the data stream is ASCII based (step 404). If no, the method 400 returns to step 402. If yes, the method 400 converts the data stream into a minimized data representation (step 406). The method 400 may build a suffix tree (step 408). The suffix tree is minimized (step 410). The method 400 will then build a proposed table boundaries formation patterns list (step 412). The method 400 will find the most common table format patterns (e.g., the longest matching formats are favored and preferred) (step 414). The method 400 may then reorder the data stream by adding \n before every identified pattern found (step 416). The method 400 will repeat each of the previous steps for finding subsequent tables, if they exist, and returns to step 404.

Figure 5A:
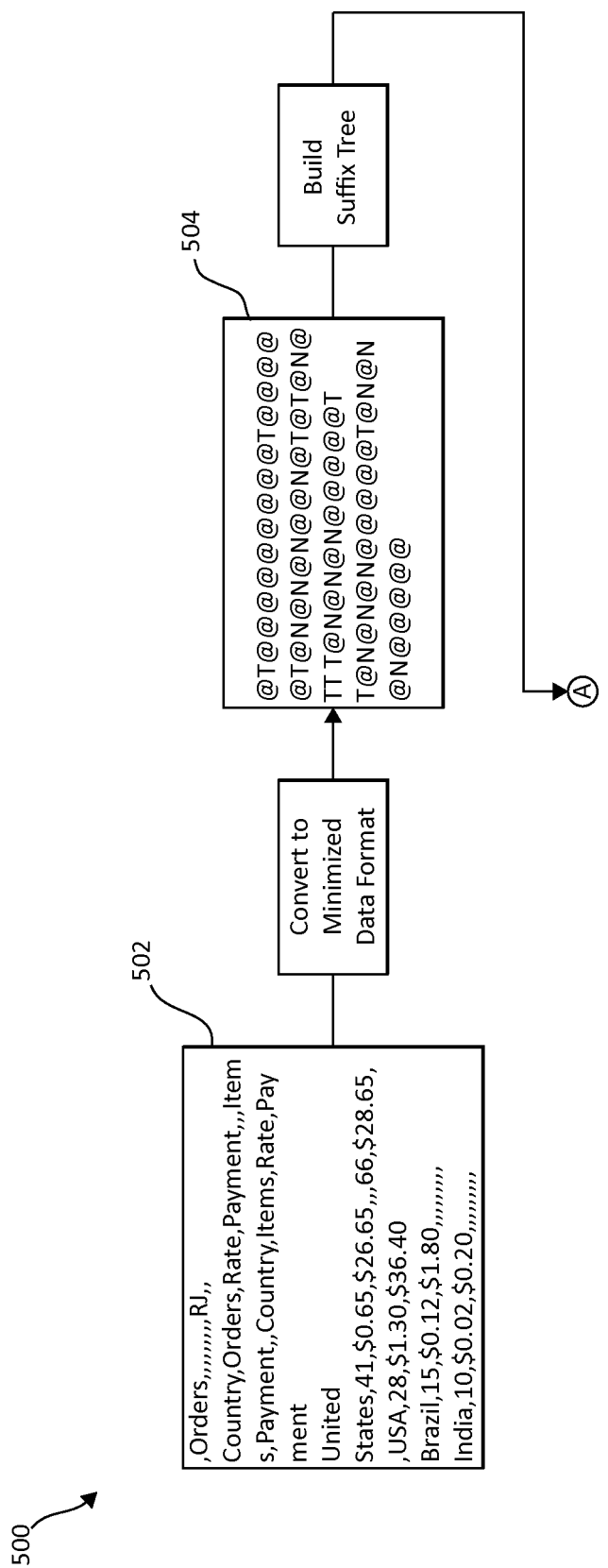

FIGS. 5A and 5B, following, illustrates an additional exemplary method 500 for identifying the best-suggested data table format. The method 500 begins by converting data to a minimized data format (step 502). It should be noted that sample data, suffix trees, and other various examples and figures are illustrated in FIG. 5 to show the results of each of the steps of method 500. A suffix tree is built (step 504). The method 500 eliminates all leafs (e.g., scan orders) that do not match any of the scan rules, as described above (step 508). The method 500 finds the most common table format patterns (e.g., the longest matching formats are favored and preferred) (step 510). The method 500 reorders the data stream by adding \n before every table format patterns (step 512). The method 500 ends (514).

As mentioned previously, by providing an operation for detecting table boundaries by building a minimized data block mapping schema and then sorting the mapping block in a manner which identifies "best" table formation matches, the data may more efficiently may be sorted into a reordered (e.g., sorted) data output stream for compression. Within the sorted data output file, header information may be listed containing the identified table boundary pattern. Also within the reordered (sorted) data output stream, a separator symbol may be added before every detected table boundary pattern in order to differentiate the table boundaries. The output file may also contain the size (e.g., the number of rows) and the number of tables found. With the information as described above in the reordered data output file, the data stream may be compressed and is fully reversible for decoding back into the original data stream. FIG. 6, following, illustrates an exemplary output data file 600 with header information. In the output file 600, header information is listed containing the identified table format pattern (e.g., labeled as "format"), the separator symbol, the size (e.g., the number of rows), and the number of tables found. These steps may be repeated for finding subsequent tables, if they exist.

According to the forgoing discussion of identifying table boundaries in data block compression, compressing each column independently will provide a higher compression ratio rather than compressing the entire table with one stream. It should be noted that a variety of compression techniques may be used to accomplish the mechanisms of the present invention (e.g., column compression). The reason for the increased compression ratio is that the data in each column is relatively homogeneous. As a result, efficiency and productivity is increased based upon the mechanisms of the present invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wired, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention have been described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the above figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While one or more embodiments of the present invention have been illustrated in detail, the skilled artisan will appreciate that modifications and adaptations to those embodiments may be made without departing from the scope of the present invention as set forth in the following claims.

What is claimed is:

1. A system for identifying table boundaries in data blocks for compression in a computing environment, the system comprising:
   a processor device, operable in the computing environment, wherein the processor device is adapted for:
      converting data into a minimized data representation using a suffix tree by sorting data streams according a plurality of symbolic representations for building table boundary formation patterns, wherein the converted data is fully reversible for reconstruction while retaining minimal header information;
         searching a suffix of each of the sorted data streams for identifying a data sequence that includes the first and second symbol representing the textual and numerical data,
         skipping the data that only includes the third symbol until identifying the next data sequence that includes the first and second symbol representing the textual and numerical data,
         building the suffix tree for the converted data, and
         eliminating each scan-order not matching the searching and the skipping.

2. The system of claim 1, wherein the processor device is further adapted for, in conjunction with the sorting the data streams according to the plurality of symbolic representations, replacing textual data with a first symbol and numerical data with a second symbol, wherein a third symbol is used for replacing delimiters used for separation.

3. The system of claim 2, wherein the textual data is a sequence of characters not included in a delimiters list and a digits list, and the numerical data is a sequence of digit characters not included in the delimiters list.

4. The system of claim 1, wherein the processor device is further adapted for, in conjunction with the sorting, matching together those of the table boundary formation patterns that are similar for identifying a longest minimized data representation table boundary formation pattern.

5. The system of claim 4, wherein the processor device is further adapted for performing at least one of:
   reordering each of the table boundary formation patterns to form an output data file, and
   adding to a header of the output data file at least the table boundary formation patterns, a number of rows of the output data file, and a third symbol used for separation of the table boundary formation patterns.

6. The system of claim 4, wherein the processor device is further adapted for, in conjunction with the matching, searching for node branches within the suffix tree.

7. The system of claim 1, wherein the processor device is further adapted for performing the converting for a plurality of data type blocks.

8. A computer program product for identifying table boundaries in data blocks for compression by a processor device, the computer program product comprising a non-transitory computer-readable storage medium having computer-readable program code portions stored therein, the computer-readable program code portions comprising:
   a first executable portion for converting data into a minimized data representation using a suffix tree by sorting data streams according a plurality of symbolic representations for building table formation patterns, wherein the converted data is fully reversible for reconstruction while retaining minimal header information;
      searching a suffix of each of the sorted data streams for identifying a data sequence that includes the first and second symbol representing the textual and numerical data,
      skipping the data that only includes the third symbol until identifying the next data sequence that includes the first and second symbol representing the textual and numerical data,
      building the suffix tree for the converted data, and
      eliminating each scan-order not matching the searching and the skipping.

9. The computer program product of claim 8, further including a second executable portion for, in conjunction with the sorting the data streams according to the plurality of symbolic representations, replacing textual data with a first symbol and numerical data with a second symbol, wherein a third symbol is used for replacing delimiters used for separation.

10. The computer program product of claim 9, wherein the textual data is a sequence of characters not included in a delimiters list and a digits list, and the numerical data is a sequence of digit characters not included in the delimiters list.

11. The computer program product of claim 8, further including a second executable portion for, in conjunction with the sorting, matching together those of the table boundary formation patterns that are similar for identifying a longest minimized data representation table boundary formation pattern.

12. The computer program product of claim 11, further including a third executable portion for performing at least one of:
   reordering each of the table boundary formation patterns to form an output data file, and
   adding to a header of the output data file at least the table boundary formation patterns, a number of rows of the output data file, and a third symbol used for separation of the table boundary formation patterns.

13. The computer program product of claim 11, further including a third executable portion for, in conjunction with the matching, searching for node branches within the suffix tree.

14. The computer program product of claim 8, further including a second executable portion for performing the converting for a plurality of data type blocks.

* * * * *